United States Patent
Chen et al.

(10) Patent No.: US 12,041,761 B2
(45) Date of Patent: Jul. 16, 2024

(54) SRAM CIRCUITS WITH ALIGNED GATE ELECTRODES

(71) Applicant: Taiwan Semiconductor Manufacturing Co., Ltd., Hsinchu (TW)

(72) Inventors: Fang Chen, Hsinchu (TW); Jhon Jhy Liaw, Zhudong Township (TW); Min-Chang Liang, Zhu-Dong Town (TW); Ren-Fen Tsui, Taipei (TW); Shih-Chi Fu, Zhudong Township (TW); Yen-Huei Chen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 18/182,489

(22) Filed: Mar. 13, 2023

(65) Prior Publication Data

US 2023/0225100 A1    Jul. 13, 2023

Related U.S. Application Data

(63) Continuation of application No. 17/345,309, filed on Jun. 11, 2021, now Pat. No. 11,605,637, which is a continuation of application No. 16/450,068, filed on Jun. 24, 2019, now Pat. No. 11,037,934, which is a continuation of application No. 15/871,450, filed on Jan. 15, 2018, now Pat. No. 10,332,896, which is a continuation of application No. 15/202,053, filed on Jul. 5, 2016, now Pat. No. 9,871,046.

(60) Provisional application No. 62/299,247, filed on Feb. 24, 2016.

(51) Int. Cl.
 *H10B 10/00* (2023.01)
 *G11C 11/418* (2006.01)
 *H01L 23/528* (2006.01)
 *H01L 27/02* (2006.01)

(52) U.S. Cl.
 CPC ............ *H10B 10/12* (2023.02); *G11C 11/418* (2013.01); *H01L 23/528* (2013.01); *H01L 27/0207* (2013.01); *H10B 10/18* (2023.02)

(58) Field of Classification Search
 CPC ....... H10B 10/12; H10B 10/18; H01L 23/528; H01L 27/0207
 See application file for complete search history.

(56) References Cited

U.S. PATENT DOCUMENTS

| 7,577,040 B2 | 8/2009 | Liaw |
| 8,174,868 B2 | 5/2012 | Liaw |
| 8,605,523 B2 | 12/2013 | Tao et al. |

(Continued)

FOREIGN PATENT DOCUMENTS

| CN | 101110424 A | 1/2008 |
| CN | 102034825 A | 4/2011 |

*Primary Examiner* — Thao P Le
(74) *Attorney, Agent, or Firm* — Slater Matsil, LLP

(57) ABSTRACT

A device includes a Static Random Access Memory (SRAM) array, and an SRAM cell edge region abutting the SRAM array. The SRAM array and the SRAM cell edge region in combination include first gate electrodes having a uniform pitch. A word line driver abuts the SRAM cell edge region. The word line driver includes second gate electrodes, and the first gate electrodes have lengthwise directions aligned to lengthwise directions of respective ones of the second gate electrodes.

20 Claims, 10 Drawing Sheets

(56) References Cited

U.S. PATENT DOCUMENTS

| | | |
|---|---|---|
| 8,630,132 B2 | 1/2014 | Cheng et al. |
| 8,760,948 B2 | 6/2014 | Tao et al. |
| 8,952,423 B2 | 2/2015 | Jeon et al. |
| 9,515,077 B1 | 12/2016 | Liaw |
| 9,871,046 B2 | 1/2018 | Chen et al. |
| 10,332,896 B2 | 6/2019 | Chen et al. |
| 11,037,934 B2 * | 6/2021 | Chen .................. G11C 11/418 |
| 11,107,929 B2 | 8/2021 | Yamazaki |
| 11,114,471 B2 | 9/2021 | Doyle |
| 11,251,227 B2 | 2/2022 | Pillarisetty |
| 11,289,490 B2 | 3/2022 | Pillarisetty |
| 11,302,626 B2 | 4/2022 | Lee |
| 11,302,627 B1 | 4/2022 | Chen |
| 11,398,560 B2 | 7/2022 | Dewey |
| 11,417,770 B2 | 8/2022 | Sharma |
| 11,462,566 B2 | 10/2022 | Lee |
| 2003/0178648 A1 | 9/2003 | Bansal |
| 2005/0041149 A1 | 2/2005 | Chan et al. |
| 2007/0272985 A1 * | 11/2007 | Hsieh .................. H01L 27/0207 257/E27.098 |
| 2008/0094870 A1 | 4/2008 | Tsujimura et al. |
| 2010/0044755 A1 | 2/2010 | Tsuda et al. |
| 2011/0068413 A1 | 3/2011 | Liaw |
| 2011/0075470 A1 | 3/2011 | Liaw |
| 2012/0175609 A1 | 7/2012 | Yamazaki |
| 2012/0193681 A1 | 8/2012 | Or-Bach |
| 2013/0077387 A1 | 3/2013 | Yabuuchi |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2015/0243667 A1 * | 8/2015 | Liaw ...................... H10B 10/18 716/110 |
| 2016/0093622 A1 | 3/2016 | Luan et al. |
| 2023/0137806 A1 * | 5/2023 | Huang .................. H01L 23/535 257/369 |

* cited by examiner

SRAM CIRCUITS WITH ALIGNED GATE ELECTRODES

PRIORITY CLAIM AND CROSS-REFERENCE

This application is a continuation of U.S. patent application Ser. No. 17/345,309, entitled "SRAM Circuits with Aligned Gate Electrodes," filed Jun. 11, 2021, which is a continuation of U.S. patent application Ser. No. 16/450,068, entitled "SRAM Circuits with Aligned Gate Electrodes," filed Jun. 24, 2019, now U.S. Pat. No. 11,037,934, issued Jun. 15, 2021, which is a continuation of U.S. patent application Ser. No. 15/871,450, entitled "SRAM Circuits with Aligned Gate Electrodes," filed Jan. 15, 2018, now U.S. Pat. No. 10,332,896 issued Jun. 25, 2019, which is a continuation of U.S. patent application Ser. No. 15/202,053, entitled "SRAM Circuits with Aligned Gate Electrodes," filed Jul. 5, 2016, now U.S. Pat. No. 9,871,046 issued Jan. 16, 2018, which claims the benefit of the following provisionally filed U.S. Patent application: Application Ser. No. 62/299,247, filed Feb. 24, 2016, and entitled "SRAM & Logic Poly Fully Aligned," which applications are hereby incorporated herein by reference.

BACKGROUND

Static Random Access Memory (SRAM) is commonly used in integrated circuits. SRAM cells have the advantageous feature of holding data without a need of refreshing. SRAM cells may include different numbers of transistors, and are often accordingly referred to by the number of transistors, for example, six-transistor (6-T) SRAM, eight-transistor (8-T) SRAM, and the like. The transistors typically form a data latch for storing a bit. Additional transistors may be added to improve the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or read from, the SRAM cell.

SRAM array are connected to a plurality of peripheral circuits, such as word line drivers and input/output circuits such as read/write circuits, which are used for writing data into the SRAM array, and reading data out of the SRAM array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
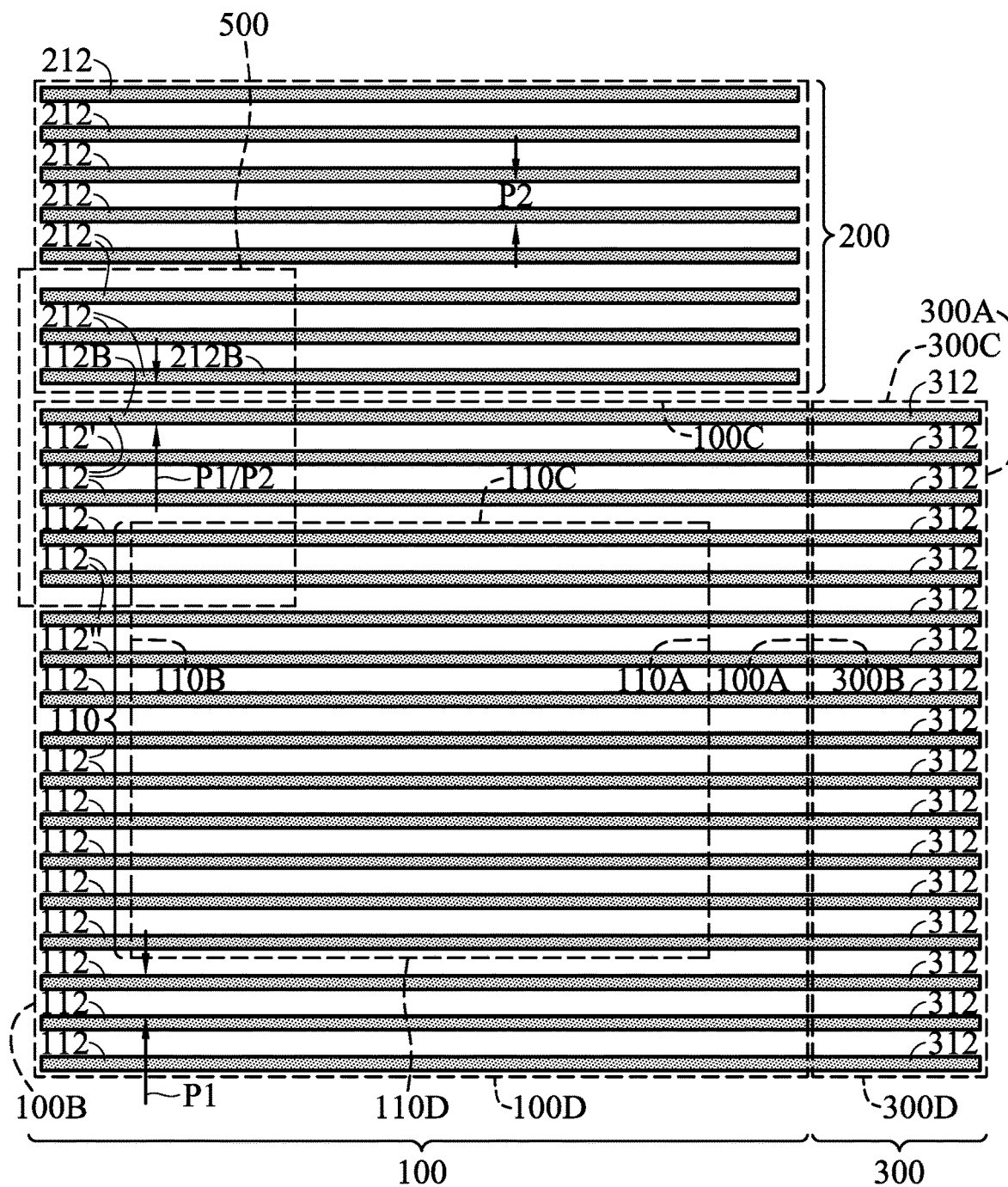
FIG. 1 illustrates a schematic top view of an SRAM array, an SRAM edge cell region, an Input/output (IO) block, a word line driver, and respective gate electrodes in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static Random Access Memory (SRAM) array and peripheral circuits of the SRAM array are provided in accordance with various exemplary embodiments. Some variations of some embodiments are discussed. Throughout the various views and illustrative embodiments, like reference numbers are used to designate like elements.

FIG. 1 illustrates a schematic top view of SRAM array 110, SRAM edge cell regions 100, Input/output (IO) block 200, and word line driver 300 in accordance with some embodiments of the present disclosure. SRAM array 110 includes SRAM cells arranged as a plurality of rows and a plurality of columns. More details of SRAM array 110 are provided in FIGS. 2 and 3 in accordance with some exemplary embodiments of the present disclosure. SRAM edge cell region 100 abuts SRAM cell array 100 and include SRAM edge cells. In accordance with some embodiments, as shown in FIG. 1, SRAM edge cell region 100 extends on all four sides (in +X, −X, +Y, and −Y directions) of SRAM array 110, and hence forms a ring-shaped region encircling SRAM array 110. The inner edges of the ring-shaped SRAM edge cell region 100 abut the respective outer edges of SRAM array 110. Accordingly, the inner edges of SRAM edge cell region 100 abut the edges of the SRAM cells 102 (FIG. 2) in SRAM array 110. In accordance with alternative embodiments, SRAM edge cell region 100 are formed on one side, two sides, or three sides of SRAM array 110 in any combination, while the remaining sides of SRAM array 110 has no SRAM edge cells abutting them. For example, SRAM edge cell region 100 may extend on the +X and +Y sides of SRAM array 110, and not on the −X and/or −Y sides of SRAM array 110. In yet alternative embodiments, SRAM edge cell region 100 includes portions on the +X side, while there is no SRAM edge cells on the −X side, +Y side, and −Y side, of SRAM array 110.

Figure 2:
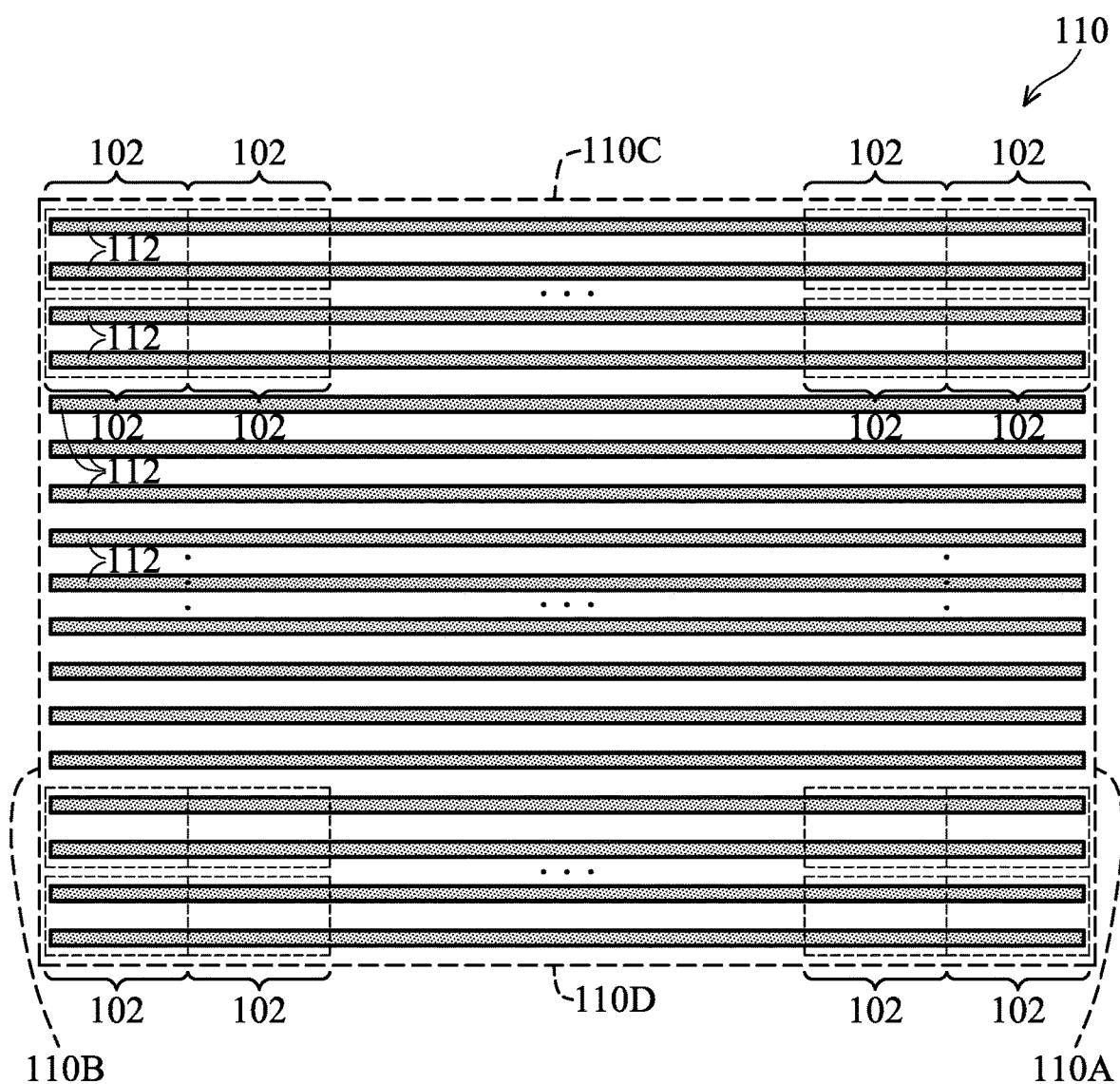
FIG. 2 illustrates a schematic top view of an SRAM array and respective gate electrodes in accordance with some embodiments.
Figure 3:
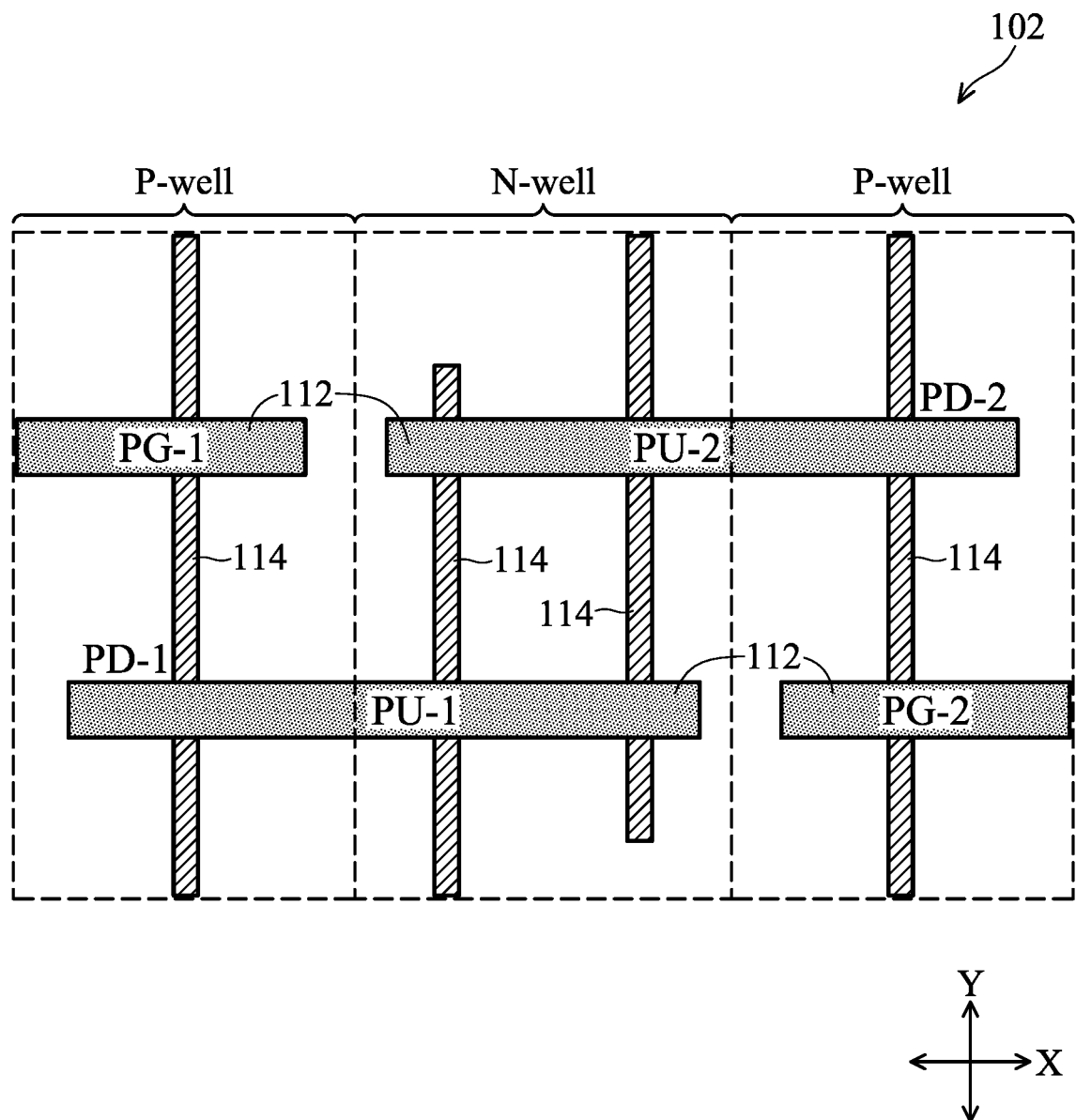
FIG. 3 illustrates an exemplary SRAM cell and respective gate electrodes in accordance with some embodiments.
Figure 4:
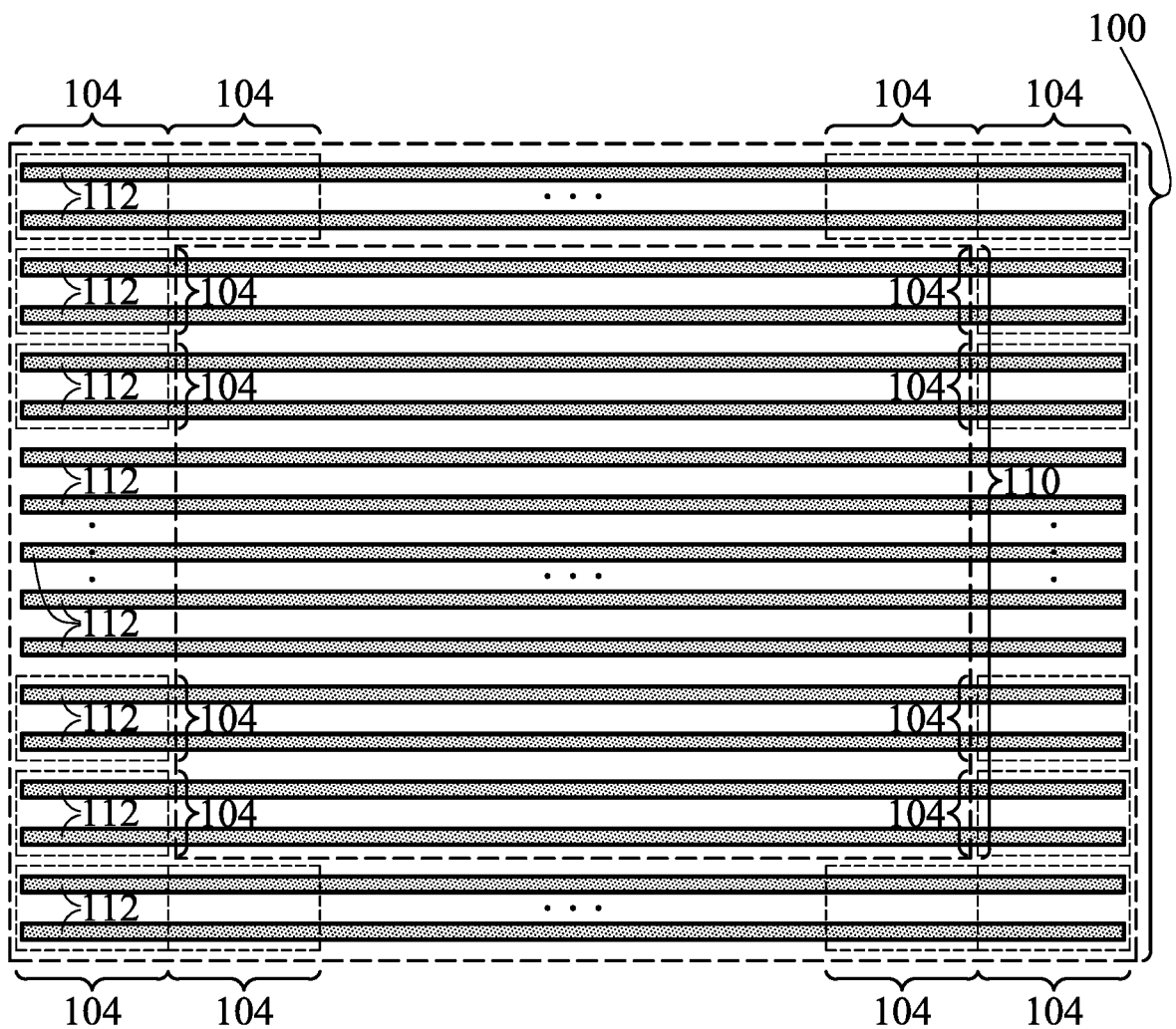
FIG. 4 illustrates SRAM edge cells in an SRAM edge cell region and the respective gate electrodes in accordance with some embodiments.
Figure 5:
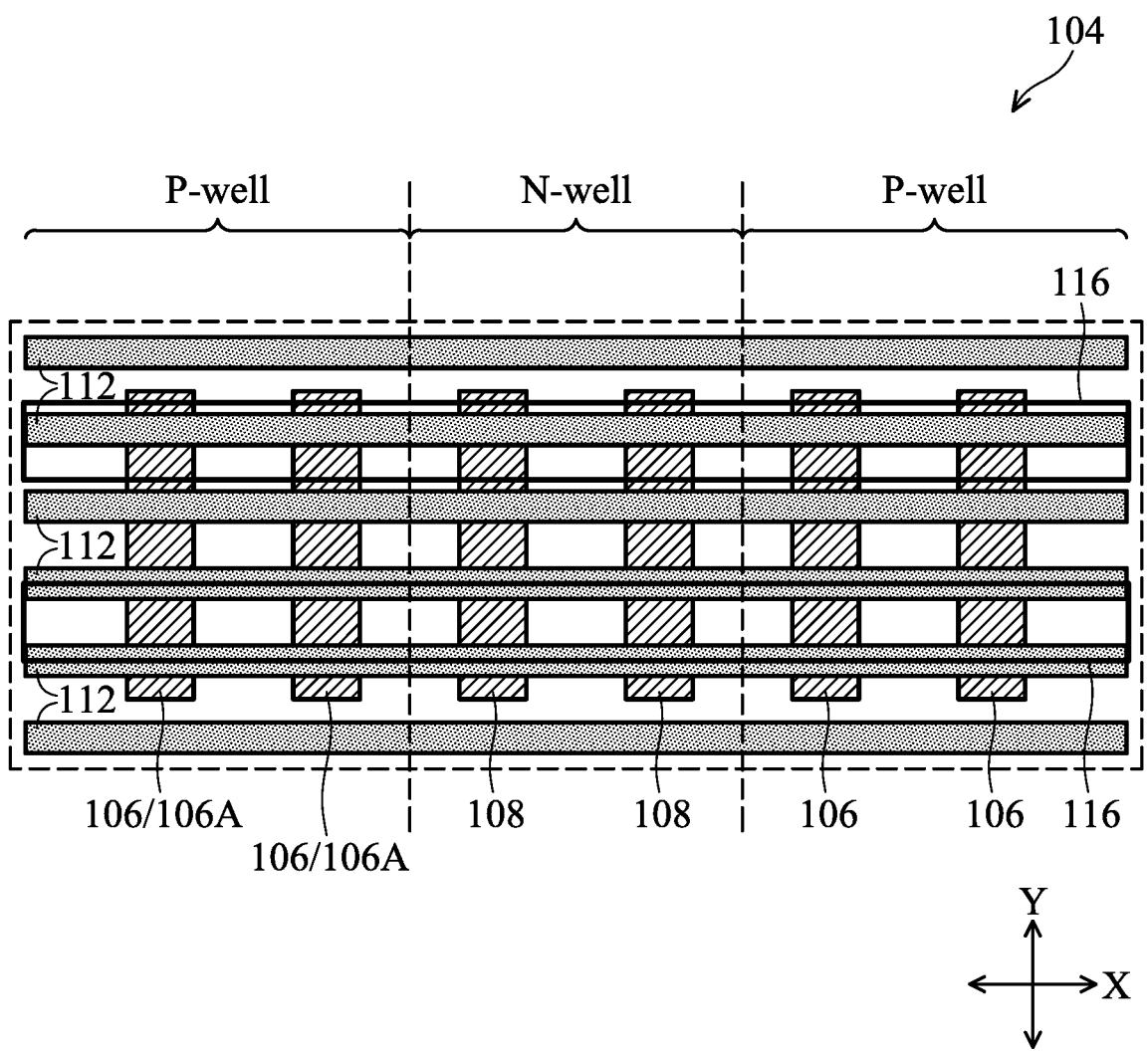
FIG. 5 illustrates an exemplary SRAM edge cell and respective gate electrodes in accordance with some embodiments.

SRAM array 110 includes a plurality of SRAM cells 102 arranged as a plurality of rows and a plurality of columns, and exemplary SRAM cells 102 are schematically illustrated in FIGS. 2 and 3. SRAM edge cell region 100 may include edge cells 104 (FIGS. 4 and 5). Edge cells 104 are sometimes referred to as strap cells 104, which include the pickup regions of p-well regions and n-well regions, and the metal lines (such as word lines, bit lines, VDD power lines, VSS power lines, etc.) connected between SRAM cells 102 and peripheral circuits such as word line drivers 300, IO block 200, and power sources (not shown).

Referring back to FIG. 1, SRAM peripheral circuits for supporting SRAM array 110 include IO block 200 and word line driver 300. In accordance with some embodiments of the present disclosure, IO block 200 includes the circuits that are configured to read the data stored in SRAM array 110, and the circuits that are configured to write data into SRAM array 110. In accordance with some embodiments of the present disclosure, IO block 200 includes, and is not limited to, write driver(s), read sensing amplifier(s), multiplexers, and the like. IO block 200 is electrically coupled to SRAM array 110 through metal lines that are formed in the metallization layers of the respective chips. The metal lines include, and are not limited to, bit lines (not shown), wherein the data read from and written into SRAM array 110 are carried through the bit lines. The bit lines may have lengthwise directions parallel to the +Y/−Y directions.

As also shown in FIG. 1, word line driver 300 is configured to provide word line signals to the word lines of SRAM array 110, so that a selected row of SRAM cells in SRAM array 110 may be selected or deselected for a read or write operation. For example, when a specific row of SRAM array 110 is selected for a read or write operation, word line driver 300 may supply a positive voltage to the word line of the respective row in order to select the row. Conversely, when a specific row of SRAM array 110 is not selected for the read or write operation, word line driver 300 may supply a low voltage (such as the electrical ground voltage) to the word line of the respective row in order to deselect the row. Word line driver 300 is electrically coupled to SRAM cells in SRAM array 110 through metal lines that are formed in the metallization layers of the respective chips, wherein the metal lines include, and are not limited to, word lines (not shown). The word lines may have lengthwise directions parallel to the +Y/−Y directions.

FIG. 1 also schematically illustrates a plurality of gate electrodes 112, 212, and 312, which include active gate electrodes of transistors and dummy gate electrodes that do not form the gate electrodes of any transistor. In accordance with some embodiments of the present disclosure, gate electrodes 112, 212, and 312 are formed of polysilicon. In accordance with alternative embodiments, gate electrodes 112, 212, and 312 are formed of other conductive materials such as metal or metal alloy, metal silicide, metal nitride, or the like. Furthermore, some parts of the gate electrodes 112, 212, and 312 may be formed of polysilicon, while some other parts of the gate electrodes 112, 212, and 312 are replacement gates, wherein metals are used to replace the polysilicon.

It is appreciated that FIG. 1 illustrates the likely positions of gate electrodes 112, 212, and 312. To form functional circuits, the illustrated continuous gate electrodes 112, 212, and 312, which are illustrated as extending continuously throughout regions 100, 200, and 300, may actually be cut apart into shorter pieces. For example, as shown in FIG. 3, gate electrodes 112 of the transistors in SRAM cell 102 have breaks therebetween, so that the gate electrodes of different transistors may be electrically decoupled from each other when needed. Otherwise, the gate electrode of pass-gate transistor PG-1 will be undesirably connected to the gate electrodes of pull-up transistor PU-2 and pull-down transistor PD-2, and the gate electrode of pass-gate transistor PG-2 will be undesirably connected to the gate electrodes of pull-up transistor PU-1 and pull-down transistor PD-1, hence causing circuit failure. For simplicity, in FIG. 1 and the subsequent figures, the breaks for breaking gate electrodes 112 are not illustrated, while they may exist. Similarly, gate electrodes 212 and 312 may also be broken into shorter pieces to form functional circuits in regions 200 and 300. The gate electrodes that are broken into pieces, however, are allocated at the positions as illustrated in Figures of the present disclosure. In the design and manufacturing process of the illustrated circuits on physical wafers, gate electrodes 112, 212, and 312 may be initially formed as long and continuous strips as illustrated in FIG. 1, and then etched (cut) into shorter pieces as needed in subsequent processes.

SRAM array 110 and SRAM edge cell region 100 have gate electrodes 112, which have a uniform pitch P1. Alternatively stated, all gate electrodes 112 of SRAM array 110 and SRAM edge cell region 100 may have an equal spacing and an equal width. Gate electrodes 112 may have same or different lengths, and extend into various regions. For example, some, but not all, gate electrodes 112 (such as 112') may continuously extend from edge 100B to the opposite edge 100A of SRAM edge cell region 100, with no break therein. Some of gate electrodes 112 may continuously (physically) extend from SRAM array 110 into SRAM edge cell region 100. Some other electrodes 112 may have breaks in regions 100 and/or 110. In addition, if some strap cells are embedded in SRAM array 110, there may also be some gate electrodes 112 (schematically illustrated as 112" as an example) that continuously extend from the SRAM edge cell region 100 on the left side of SRAM array 110 into SRAM array 110, and further into the SRAM edge cell region 100 on the right side of SRAM array 110, with no break in gate electrodes 112". Clearly, those gate electrodes 112 that form the gate electrodes of the transistors in SRAM array 110 will have breaks therein.

Figure 8:
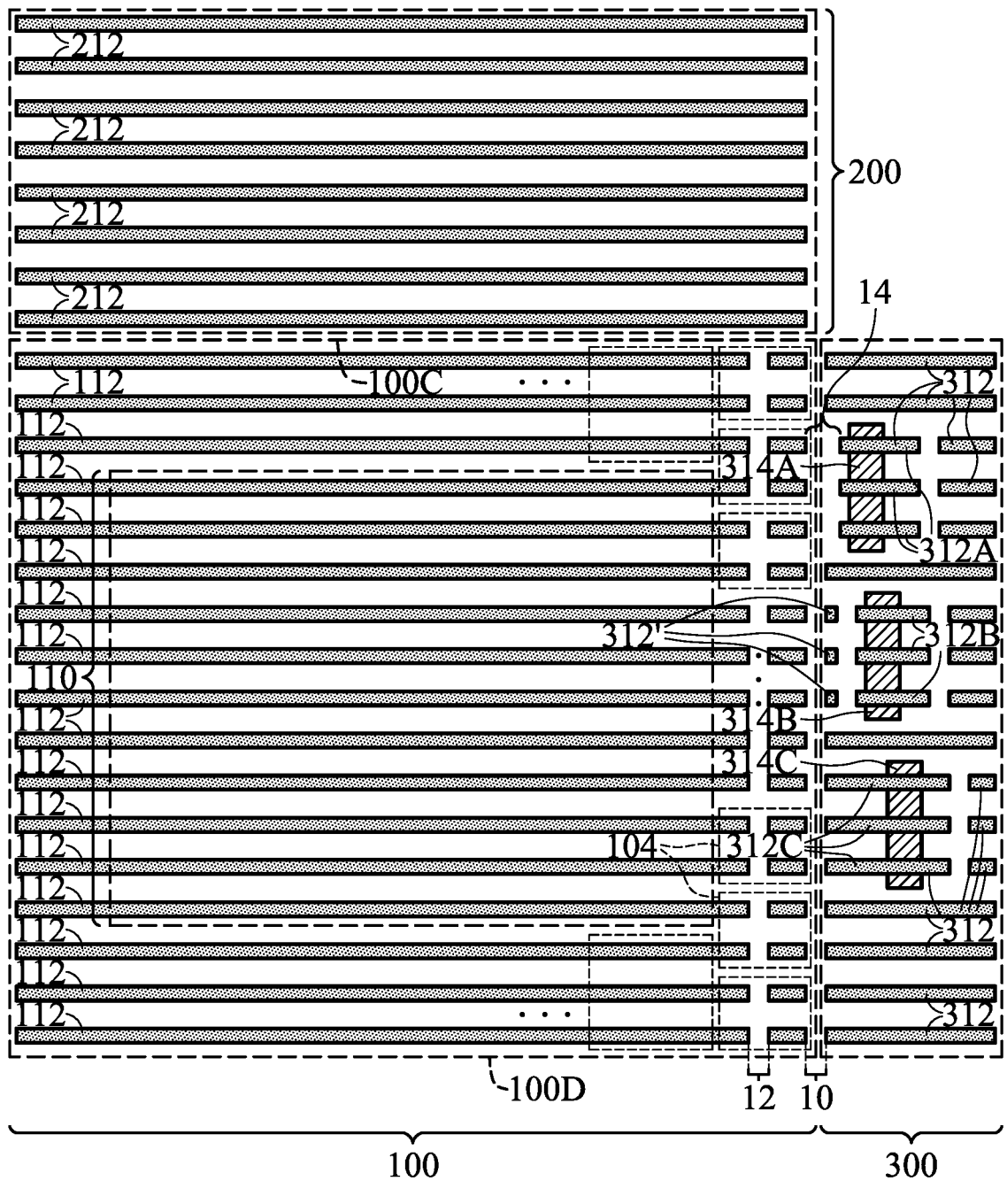
FIGS. 8 and 9 illustrate boundary regions between a word line driver and an SRAM edge cell region in accordance with some embodiments.

Word line driver 300 has gate electrodes 312, which also have uniform pitch P1. The lengthwise directions of gate electrodes 312 are aligned to the respective lengthwise directions of gate electrodes 112. Furthermore, the spacings and the widths of gate electrodes 312 may also be the same as the corresponding ones of gate electrodes 112. SRAM edge cell region 100 abuts word line driver 300, with no spacing separates them from each other. Accordingly, gate electrodes 112 and 312 may include various connecting schemes. For example, some of gate electrodes 112 may continuously extend into word line driver 300 and hence are physically connected to the respective gate electrodes 312. Some of gate electrodes 312 may be physically connected to the gate electrodes 112 that continuously extend into SRAM edge cell 100. Some other gate electrodes 112 may be separate from the respective (aligning) gate electrodes 312 at the interface between SRAM edge cell region 100 and word line driver 300, as is shown in FIG. 8. Furthermore, some gate electrodes such 112' are also connected to the gate electrodes 312 that extend from edge 300B to the opposite edge 300A. Accordingly, these gate electrodes 112' may penetrate through both regions 100 and 300.

IO block 200 has gate electrodes 212, which have uniform pitch P2. In accordance with some embodiments of the present disclosure, uniform pitch P2 is equal to uniform pitch P1. In accordance with alternative embodiments, uniform pitch P2 is different from pitch P1. Also, the boundary gate electrode 112 and the boundary gate electrodes 212 that are immediately neighboring each other has a spacing equal to the spacings of gate electrodes 112 and/or the spacings of gate electrodes 212. Alternatively stated, the boundary gate electrode 112B and its immediate neighboring boundary gate electrode 212B also have the pitch (marked as P1/P2) equal to pitch P1 or pitch P2, which may be equal to, or different from, each other. Accordingly, SRAM edge cell region 100 abuts IO block 200, with no spacing separating them from each other.

FIG. 2 illustrates an exemplary top view of SRAM array 110, which includes SRAM cells 102 arranged as a plurality of rows and columns. FIG. 3 illustrates a part of the layout of an exemplary SRAM cell 102. It is appreciated that SRAM cells 102 may adopt many different designs, including and not limited to, six-transistor SRAM cell, eight-transistor SRAM cell, ten-transistor SRAM cell, single port SRAM cell, two port SRAM cell, dual-port SRAM cell, etc. In accordance with some embodiments of the present disclosure, SRAM cell 102 includes pass-gate transistors PG-1 and PG-2, pull-up transistors PU-1 and PU-2, and pull-down transistors PD-1 and PD-2, wherein pull-up transistors PU-1 and PU-2 and pull-down transistors PD-1 and PD-2 are connected to form a latch storing a bit. Gate electrodes 112 extend in the X direction, while active regions (which may be semiconductor fins) 114 extending in the Y direction. As shown in FIG. 2, gate electrodes 112 are broken into short pieces, while the positions of the broken gate electrodes 112 are aligned to the positions of gate electrodes 112 as shown in FIG. 1, wherein all gate electrodes 112 throughout SRAM array 110 and edge cell region 100 have uniform pitch P1.

Referring back to FIG. 2, SRAM cells 102 may have structures identical to each other (while some SRAM cells 102 may be mirrored/flipped from others). The edges of SRAM array 110 are defined by the outmost edges of the edge SRAM cells. For example, left edge 110B is defined by the left edges of the left-most SRAM cells 102, and right edge 110A is defined by the right edges of the right-most SRAM cells 102. In accordance with some exemplary embodiments of the present disclosure, the entire SRAM array 110 is occupied by SRAM cells 102, with no strap cells therein. In accordance with alternative embodiments, strap cells are placed in SRAM array 110. The strap cells may be essentially the same as edge cell 104 as shown in FIG. 5. In accordance with some exemplary embodiments, a row of strap cells may be placed every 4 rows, 8 rows, or more rows of SRAM cells 102. The strap cells in SRAM array 110 may be used for well pickup, for running metal lines that don't fit into SRAM cells 102, which metal lines may include power mesh (such as for VDD and VSS power mesh).

FIG. 4 illustrates an exemplary top view of SRAM edge cell region 100, which includes SRAM edge cells 104 abutting (and possibly surrounding) SRAM array 110. Edge cells 104 may be used for various purposes such as forming well pickup regions for the p-well regions and n-well regions, on which the transistors of SRAM cells 102 (FIG. 2) are formed. Edge cells 104 may not include any active device such as transistor and diode. For example, FIG. 5 illustrates an exemplary edge cell 104, which includes well pickup regions 106 for the pickup of p-well regions (for example, the p-well region in FIG. 3), and well pickup region(s) 108 for the pickup of n-well regions. Well pickup regions 106 and 108 are heavily doped active regions (which may be semiconductor fins). The well pickup regions of n-well regions are heavily doped n-type regions, while the well pickup regions of p-well regions are heavily doped p-type regions. In accordance with some embodiments, assuming the edge cell 104 shown in FIG. 5 is in a same column as the SRAM cell 102 as shown in FIG. 3, the left P-well region in FIG. 5 may be connected to the left P-well region in FIG. 3 as a continuous P-well region, and hence the well pickup region 106 (marked as 106A) is used for picking up the left P-well region of the SRAM cell 102 shown in FIG. 3. Similarly, the N-well region in FIG. 5 may be connected to the N-well region in FIG. 3 as a continuous N-well region, and hence the well pickup region 108 is used for picking up the N-well region of the SRAM cell 102 in FIG. 3.

FIG. 5 also illustrates exemplary metal lines 116, which are in a metal layer. Depending on where the edge cell 104 is located, metal lines 116 may be word lines, bit lines, VDD lines, and/or VSS lines. The metal lines in edge cell 104 also include metal lines having lengthwise directions parallel to the X direction and metal lines (not shown) having lengthwise directions parallel to the Y direction, wherein the metal lines extending in different directions are allocated in different metal layers such as metal layer 1, metal layer 2, metal layer 3, etc.

In accordance with some embodiments of the present disclosure, some or all of SRAM edge cells 104 aligned to the same row may have the same structure (which may be aligned to the same direction or mirrored) or different structures, and some or all of SRAM edge cells 104 aligned to the same column may have the same structure (which may be aligned to the same direction or mirrored) or different structures.

Figure 6:
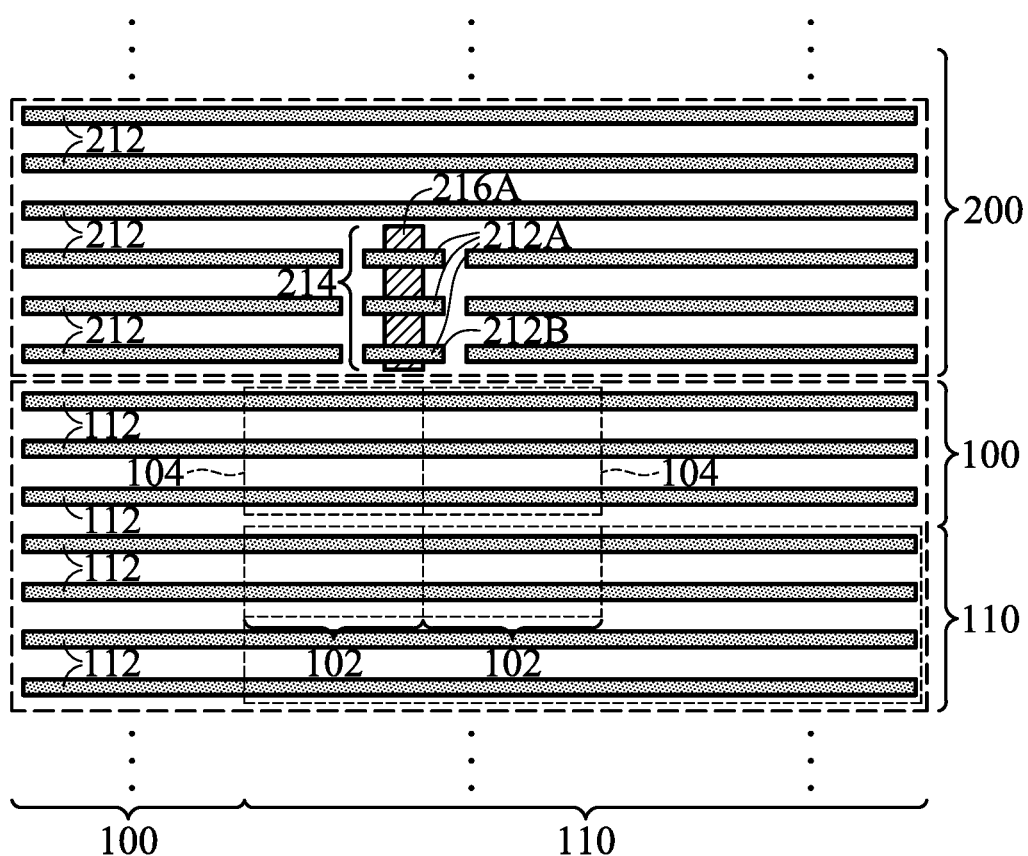
FIGS. 6 and 7 illustrate boundary regions between an IO block and an SRAM edge cell region in accordance with some embodiments.

FIG. 6 illustrates a top view of a boundary region of SRAM edge cell region 100 and IO block 200 in accordance with some embodiments of the present disclosure, wherein the boundary region is schematically illustrated as region 500 in FIG. 1. IO block 200 include transistor 214, which includes gate electrodes 212A and active region 214A. Active region 216A forms the channel and the (common) source/drain regions of transistor 214. Transistor 214 includes the boundary gate electrode 212B as its gate. Alternatively stated, transistor 214 includes the boundary gate electrode 212B that is closest to SRAM edge cells 104, with no additional gate electrode 212 between transistor 214 and edge cells 104.

Figure 7:
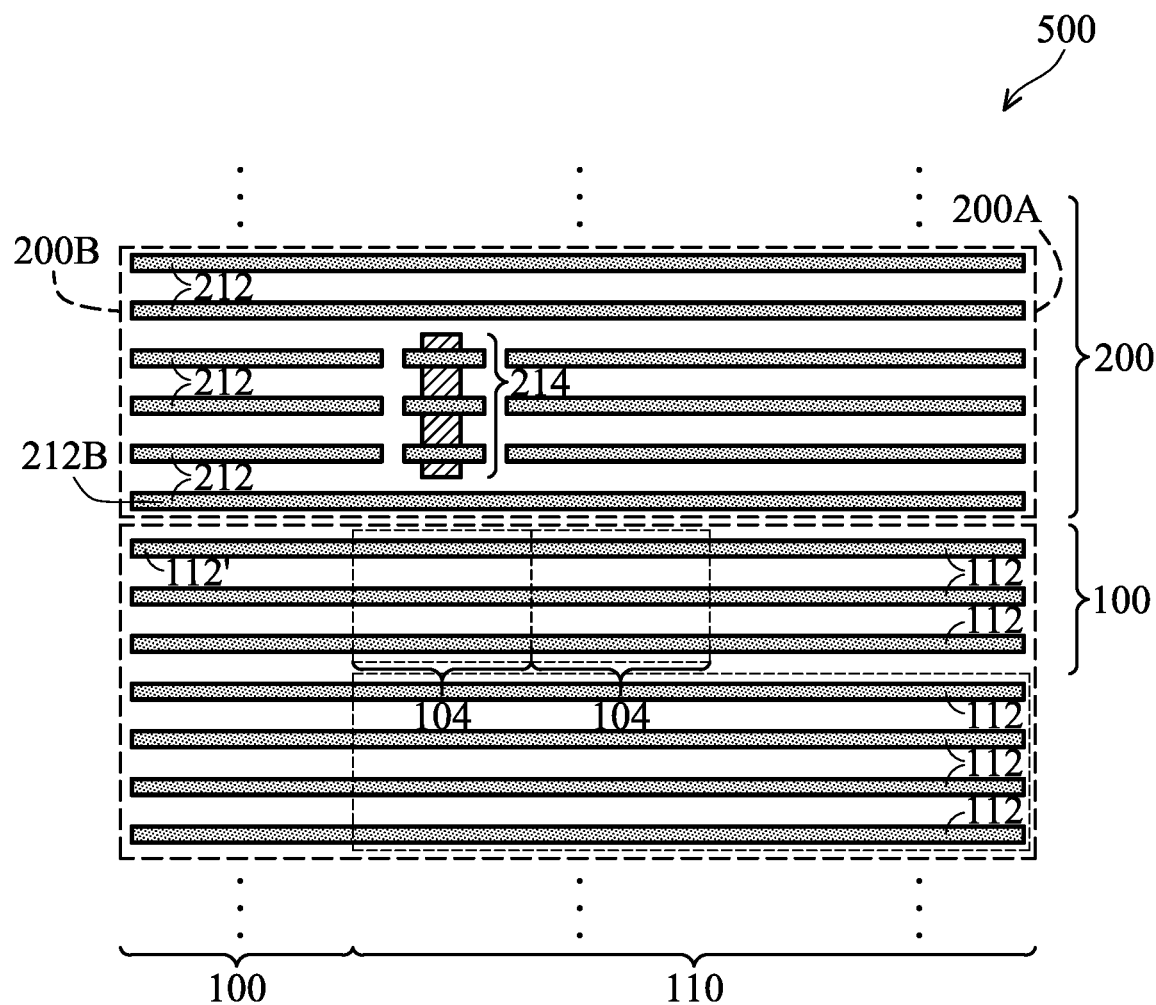

FIG. 7 illustrates a top view of a boundary region of SRAM edge cell region 100 and IO block 200 in accordance with some embodiments of the present disclosure, wherein the boundary region may be region 500 in FIG. 1. These embodiments are similar to the embodiments in FIG. 6, except dummy gate electrode 212B is located between transistor 214 and SRAM edge cells 104. Dummy gate electrode 212B may be considered as a part of IO block 200. In accordance with some embodiments, dummy gate electrode 212B extends all the way from edge 200A to the opposite edge 200B of IO block 200, with no break in dummy gate electrode 212B. In accordance with some embodiments of the present disclosure, dummy gate electrode(s) 112', which are parts of SRAM edge cells 104, also extend from edge 100A to the opposite edge 100B (FIG. 1) of SRAM edge cell region 100. In accordance with alternative embodiments, gate electrode 112' is broken into pieces.

FIG. 8 illustrates some details of the structure shown in FIG. 1 in accordance with some embodiments, wherein gate electrodes 112 and 312 and the respective transistors are illustrated. In accordance with some embodiments of the present disclosure, gate electrodes 112 are separated from gate electrodes 312 by space 10. Space 10 is formed by cutting the otherwise connected gate electrodes 112 and 312, and hence is sometimes referred to as cut-poly 10. Space 10 extends from edge 100C to edge 100D of SRAM edge cell region 100. It is observed that since space 10 is formed by cutting the originally interconnected gate electrodes 112 and 312, gate electrodes 112 and 312 have lengthwise directions aligned to each other, and have the same width, the same spacing, and the same pitch.

Word line driver 300 includes exemplary transistors 314A, 314B, and 314C. Various allocation schemes of gate electrodes 312 relative to space 10 may be adopted. For example, gate electrode 312A of transistor 314A may be spaced apart from space 10 by an additional space 14. Gate electrode 312B of transistor 314B may be spaced apart from space 10 by some discrete portions of dummy gate electrodes 312'. Gate electrode 312C of transistor 314B, on the other hand, may extend all the way to space 10.

In accordance with some embodiments of the present disclosure, in addition to space 10, space 12 may also be formed in SRAM edge cells 104, and extend in the Y direction. Space 12 may also extend from edge 100C to edge 100D of SRAM edge cell region 100.

Figure 9:
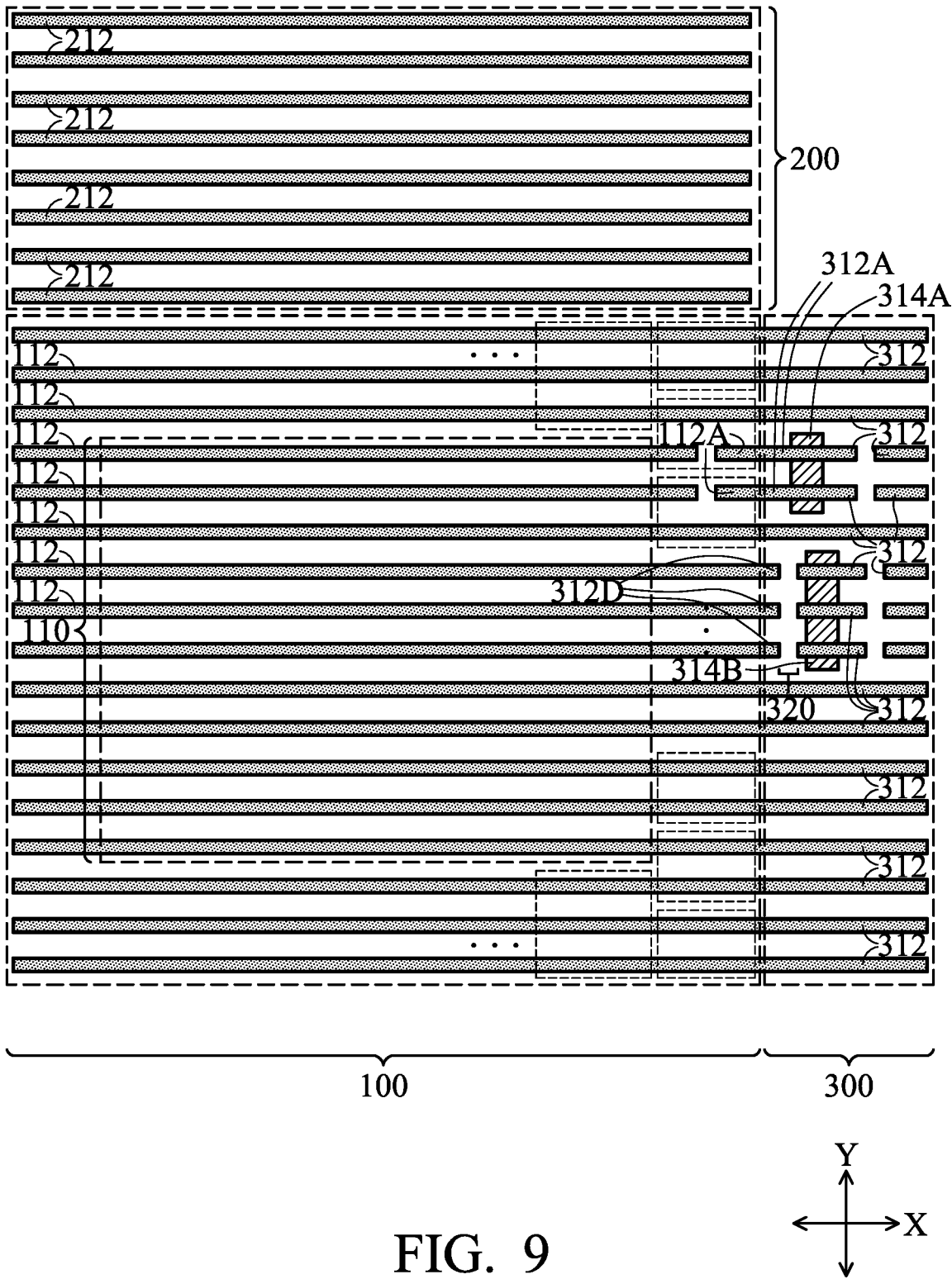

FIG. 9 illustrates some details of the structure shown in FIG. 1 in accordance with some embodiments, wherein gate electrodes 112 and 312 and the respective transistors are illustrated. Some gate electrodes 112 and the respective aligned gate electrodes 312 may be connected to each other with no breaking. For example, the gate electrodes 312A of transistor 314A is connected to the respective gate electrodes 112A, wherein a break occurs inside edge cell region 100 in order to separate the gate electrode 312A from the rest of gate electrodes 112A. On the other hand, break 320 is formed to separate the gate electrodes of transistor 314B from gate electrode portions 312D. In accordance with some embodiments, some gate electrodes 314D and the respective connecting gate electrodes 112 form continuous gate electrodes that continuously extend from word line driver 300 all the way to SRAM array 110, as shown in FIG. 9.

Figure 10:
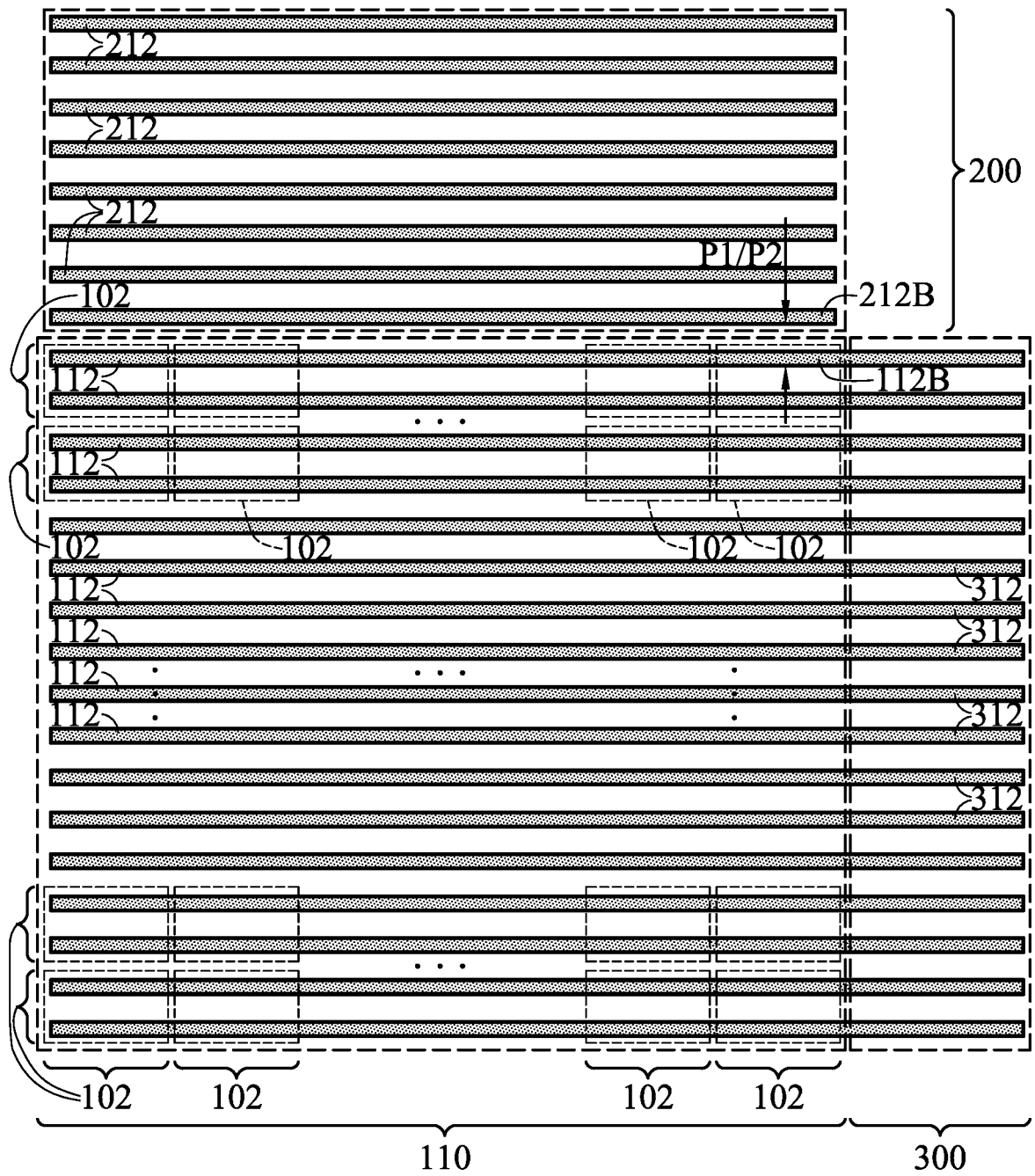
FIG. 10 illustrates a schematic top view of an SRAM array, an IO block, a word line driver, and respective gate electrodes in accordance with some embodiments.

FIG. 10 illustrates an exemplary top view of SRAM array 110, IO block 200, and word line driver 300 in accordance with some embodiments. These embodiments are similar to the embodiments shown in FIG. 1, except no SRAM edge cell region is formed. Rather, SRAM array 110 abuts IO block 200 and word line driver 300. The details of gate electrodes 112, 212, and 312 are essentially the same as in the embodiments shown in FIGS. 1 through 9 (when applicable), and hence are not repeated herein. In accordance with some embodiments, some gate electrodes 312 are continuously connected to some gate electrodes 112 (referring to FIG. 3) in SRAM cells 102. Furthermore, the boundary gate electrode 112 (neighboring IO block 200) are used to form the gate electrodes of the transistors (refer to FIG. 3) in SRAM cells. In accordance with some embodiments, strap cells are formed between the rows and/or columns of the SRAM cells in SRAM array 110, and may be formed every repeated number of rows and/or columns.

The embodiments of the present disclosure have some advantageous features. By abutting SRAM cell edge region 100 (or SRAM array 110) to word line driver 300 and IO block 200, the spaces between these regions, which spaces are adopted in conventional SRAM circuitry, are eliminated, and hence the chip area occupied by the entire SRAM circuity is reduced. In addition, by forming gate electrodes in regions/circuits 100, 200, and 300 to have a uniform pitch, the pattern-loading effect in the formation of gate electrodes is reduced, resulting in an SRAM circuitry with more uniform performance.

In accordance with some embodiments of the present disclosure, a device includes an SRAM array, and an SRAM cell edge region abutting the SRAM array. The SRAM array and the SRAM cell edge region in combination include first gate electrodes having a uniform pitch. A word line driver abuts the SRAM cell edge region. The word line driver includes second gate electrodes, and the first gate electrodes have lengthwise directions aligned to lengthwise directions of respective ones of the second gate electrodes.

In accordance with some embodiments of the present disclosure, a device includes an SRAM array including a plurality of SRAM cells. An SRAM cell edge region abuts the SRAM array. The SRAM array and the SRAM cell edge region in combination have first gate electrodes having a uniform pitch. The first gate electrodes have a first boundary gate electrode. An IO block includes second gate electrodes parallel to the first gate electrodes and having the uniform pitch. The second gate electrodes include a second boundary gate electrode immediately neighboring the first boundary gate electrode, and the first boundary gate electrode and the second boundary gate electrode have a pitch equal to the uniform pitch.

In accordance with some embodiments of the present disclosure, a device includes an SRAM array including first gate electrodes having a uniform pitch. The first gate electrodes have a first boundary gate electrode. A word line driver abuts the SRAM cell edge region. The word line driver includes second gate electrodes, and the first gate electrodes have lengthwise directions aligned to lengthwise directions of respective ones of the second gate electrodes. An IO block includes third gate electrodes parallel to the first gate electrodes and having the uniform pitch. The third gate electrodes include a second boundary gate electrode immediately neighboring the first boundary gate electrode. A pitch of the first boundary gate electrode and the second boundary gate electrode is equal to a pitch of two neighboring ones of the first gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a Static Random Access Memory (SRAM) array;
an SRAM edge cell region surrounding the SRAM array;

a first plurality of gate electrodes in the SRAM array and the SRAM edge cell region; and
a first SRAM peripheral circuit region abutting the SRAM edge cell region, wherein the first SRAM peripheral circuit region comprises a second plurality of gate electrodes, and wherein all of the first plurality of gate electrodes and the second plurality of gate electrodes are aligned to a plurality of straight lines that are parallel to each other and having a uniform pitch.

2. The device of claim 1, wherein one of the first plurality of gate electrodes in the SRAM edge cell region and one of the second plurality of gate electrodes in the first SRAM peripheral circuit region are portions of a continuous gate electrode that continuously extends from the SRAM edge cell region into the first SRAM peripheral circuit region.

3. The device of claim 1, wherein one of the first plurality of gate electrodes continuously extends from the SRAM array into the SRAM edge cell region.

4. The device of claim 1, wherein the first SRAM peripheral circuit region comprises a word-line driver.

5. The device of claim 1, wherein first ends of some of the first plurality of gate electrodes are aligned to a first straight line, and second ends of some of the second plurality of gate electrodes are aligned to a second straight line, and wherein a space between the first straight line and the second straight line separates the SRAM edge cell region from the first SRAM peripheral circuit region.

6. The device of claim 5, wherein the first SRAM peripheral circuit region comprises a dummy gate electrode, and wherein the dummy gate electrode comprises an additional end aligned to the second straight line.

7. The device of claim 5, wherein the first SRAM peripheral circuit region comprises a transistor, and a portion of one of the second plurality of gate electrodes acts as a gate electrode of the transistor, and wherein the gate electrode of the transistor has an end spaced apart from the second straight line by a space, with no gate electrode located in the space.

8. The device of claim 1 comprising a continuous gate electrode that comprises:
a first portion as a part of the first plurality of gate electrodes in the SRAM edge cell region; and
a second portion as a gate electrode in a strap cell in the SRAM array.

9. The device of claim 8, wherein the gate electrode in the strap cell is a part of a continuous gate electrode that continually extends from a first edge of the SRAM array to an opposing second edge of the SRAM array.

10. The device of claim 1, wherein the first plurality of gate electrodes are portions of a plurality of SRAM edge cells, and the plurality of SRAM edge cells comprise pickup regions of an N-well region and a P-well region.

11. The device of claim 1 further comprising a second SRAM peripheral circuit region comprising a third plurality of gate electrodes, wherein each of the third plurality of gate electrodes falls on one of the plurality of straight lines.

12. The device of claim 11, wherein the second SRAM peripheral circuit region comprises an Input-Output (IO) block.

13. The device of claim 11, wherein a spacing between the first plurality of gate electrodes and the third plurality of gate electrodes is equal to an inner spacing between two neighboring gate electrodes in the first plurality of gate electrodes.

14. A device comprising:
a Static Random Access Memory (SRAM) array comprising a plurality of SRAM cells;
an SRAM edge cell region abutting the SRAM array, wherein the SRAM array and the SRAM edge cell region in combination comprise a first plurality of gate electrodes; and
a first SRAM peripheral circuit region comprising a second plurality of gate electrodes parallel to the first plurality of gate electrodes, wherein each of the first plurality of gate electrodes and the second plurality of gate electrodes falls on one of a plurality of straight lines that are parallel to each other and having a uniform pitch, with the first plurality of gate electrodes falling on a first sub set of the plurality of straight lines, and the second plurality of gate electrodes falling on a second sub set of the plurality of straight lines.

15. The device of claim 14, wherein the first SRAM peripheral circuit region comprises an Input-Output (IO) block.

16. The device of claim 14, wherein a spacing between the first plurality of gate electrodes and the second plurality of gate electrodes is equal to an inner spacing between two neighboring gate electrodes in the first plurality of gate electrodes.

17. The device of claim 14, wherein the second plurality of gate electrodes comprise a dummy gate electrode that is closer to the SRAM edge cell region than all other ones of the second plurality of gate electrodes, and wherein the dummy gate electrode and a nearest one of the first plurality of gate electrodes have the uniform pitch.

18. A device comprising:
a Static Random Access Memory (SRAM) array comprising a first plurality of gate electrodes;
a word line driver abutting the SRAM array, wherein the word line driver comprises a second plurality of gate electrodes; and
an Input-Output (IO) block comprising a third plurality of gate electrodes, wherein all of the first plurality of gate electrodes, the second plurality of gate electrode, and the third plurality of gate electrodes fall on a plurality of straight lines that are parallel to each other and have a uniform pitch.

19. The device of claim 18 further comprising an SRAM edge cell region comprising a fourth plurality of gate electrodes, wherein the fourth plurality of gate electrodes fall on the plurality of straight lines.

20. The device of claim 19, wherein a continuous gate electrode continuously extends into the SRAM edge cell region and the word line driver.

* * * * *